(12) United States Patent
Meier et al.

(10) Patent No.: US 8,369,038 B2
(45) Date of Patent: *Feb. 5, 2013

(54) METHOD AND SYSTEM FOR DISTINGUISHING SPATIAL AND THERMAL DEFECTS ON PERPENDICULAR MEDIA

(75) Inventors: Stephen Frank Meier, Fremont, CA (US); David H. Ferry, Boulder Creek, CA (US); Hassan Jalalian, Saratoga, CA (US)

(73) Assignee: MRA Tek LLC, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/045,485

(22) Filed: Mar. 10, 2011

(65) Prior Publication Data

US 2012/0044594 A1    Feb. 23, 2012

Related U.S. Application Data

(63) Continuation of application No. 12/437,425, filed on May 7, 2009, now Pat. No. 7,929,235, which is a continuation of application No. 11/552,930, filed on Oct. 25, 2006, now Pat. No. 7,532,422.

(51) Int. Cl.
   *G11B 27/36* (2006.01)

(52) U.S. Cl. ............... 360/31; 360/53; 360/59; 360/62

(58) Field of Classification Search .......... None
   See application file for complete search history.

(56) References Cited

U.S. PATENT DOCUMENTS

| | | | | |
|---|---|---|---|---|
| 5,212,677 A | * | 5/1993 | Shimote et al. | 369/53.17 |
| 6,088,176 A | * | 7/2000 | Smith et al. | 360/46 |
| 6,151,180 A | * | 11/2000 | Bang | 360/53 |
| 6,249,396 B1 | * | 6/2001 | Gray | 360/55 |
| 6,262,859 B1 | * | 7/2001 | Cho | 360/77.08 |
| 6,310,739 B1 | * | 10/2001 | McEwen et al. | 360/25 |
| 6,965,229 B2 | * | 11/2005 | Duan et al. | 324/210 |
| 7,173,783 B1 | * | 2/2007 | McEwen et al. | 360/46 |
| 7,206,150 B2 | * | 4/2007 | Koshkina et al. | 360/53 |
| 7,271,967 B2 | * | 9/2007 | Shi et al. | 360/31 |
| 7,929,235 B2 | * | 4/2011 | Meier et al. | 360/31 |
| 2003/0053235 A1 | * | 3/2003 | Kikugawa et al. | 360/31 |
| 2006/0109000 A1 | * | 5/2006 | Makino et al. | 324/212 |
| 2007/0279788 A1 | * | 12/2007 | Andersen et al. | 360/53 |

* cited by examiner

*Primary Examiner* — Dismery Mercedes
(74) *Attorney, Agent, or Firm* — Kilpatrick Townsend & Stockton LLP

(57) ABSTRACT

Disclosed are a method and system for distinguishing spatial and thermal defects on perpendicular media. The magnetic domains of the perpendicular media are oriented to have a first polarity, scanned using a read head, oriented to have a second polarity and scanned again. The signals from the read head are combined to produce output signals having improved signal to noise ratios from which the locations of spatial and thermal defects can be identified and distinguished.

17 Claims, 11 Drawing Sheets

METHOD AND SYSTEM FOR DISTINGUISHING SPATIAL AND THERMAL DEFECTS ON PERPENDICULAR MEDIA

CROSS-REFERENCE TO RELATED APPLICATIONS

This application is a continuation of U.S. Pat. No. 7,532,422 (U.S. Ser. No. 11/552,930 filed Oct. 25, 2006), titled "Method and System for Distinguishing Spatial and Thermal Defects on Perpendicular Media", the contents of which is incorporated by reference herein in its entirety.

FIELD OF THE INVENTION

The present invention relates to the field of testing magnetic recording media, and more particularly to a method and system for identifying and distinguishing spatial and thermal defects on the surface of perpendicular media.

BACKGROUND OF THE INVENTION

Hard disks drives have become ubiquitous for high volume, non-volatile storage of electronic data. While principally used as data storage devices for computing systems, hard drives have found additional uses, including, for example, in video and audio recording systems, and in small, highly portable music playback systems. As with many types of electronic devices, very substantial efforts have been made over recent years to increase the performance of hard disk drives. These efforts have primarily been directed to increasing hard disk storage capacity, reliability and robustness, while reducing cost, size, and data access (read/write) times.

In hard disk drives, data is stored on a spinning hard disk or platter, using a recording head, in digital form, as a series of binary bits, each of which is stored at a precise, known, physical location on a surface of the disk. Typically, modern hard disk drives comprise multiple, coaxial, stacked platters, each of which comprises an aluminum or other substrate having a magnetic film deposited on both the upper and lower surfaces of the platter. As is well known in the art, data is stored by the polarization of the magnetic domains in small, well-defined areas of the magnetic film on the platter. The magnetic domains are oriented using a disk drive write head comprising a coil used to transmit a precise electromagnetic signal to orient the magnetization of a domain on the surface of the disk immediately adjacent to the head. In this manner, the magnetic field at the surface of the disk at a given location is made to represent either a logical 1 or 0, corresponding to the desired binary bit value, and can thereafter be read back (or changed) using the read/write head. In practical terms, as is well known, the data is actually stored in the form of magnetic transitions from one domain to the next.

It can be appreciated that the amount of data that can be stored on a hard disk drive is a function of both the overall available area on the disk surface and the area required to store each bit (including the area necessary to separate adjacent bit storage locations). For practical reasons, the size of the disks has actually been decreasing. Accordingly, in order to increase storage capacity, great attention has been paid to reducing the already very small area on the surface of the disk necessary to store data bits. Important factors in this effort include reducing the separation distance between the read/write head and the disk surface (the "flying height"), improving the uniformity of the magnetic film, and reducing the size of the domains so that very small areas on the usable surface of a disk can be reliably used for data storage. However, as the areal extent of the magnetic surface used for storage of a data bit is decreased, any small defects or imperfections in the area take on greater significance.

In traditional prior art hard disk drives the magnetic domains 10 are horizontally or "longitudinally" aligned on the surface of the magnetic film as depicted in FIG. 1A. Reversing the magnetization of a domain relative to the adjacent domains, causes a magnetic transition 20 which is detectable when a read/write head passes over the transition area and detects a variation in the magnetic flux above the surface of the magnetic film. However, there are practical limits to the size of horizontal magnetic domains. Specifically, after a limit is reached, smaller magnetic domains are inherently unstable due to thermal fluctuations.

New generations of hard disk drives use vertically polarized magnetic domains 30 to reduce the amount of space needed to store data, as shown in FIG. 1B. Again, magnetic transitions 40 between adjacent domains can be created using a write head and, thereafter, detected using a read head. One estimate is that vertical magnetic polarization, or "perpendicular" data storage, can increase the storage capacity of a disk ten-fold. However, vertical drives use thicker magnetic films and require a "soft" magnetically permeable underlayer 50, which can increase the manufacturing difficulty of achieving a highly uniform, planar surface.

Normally, the disk surface may be viewed as comprising a plurality of contiguous annular regions or "tracks" that are used for data storage. Track widths of vertical hard disks are of the order of 100 nanometers, and track density is of the order of 2,400,000 transitions per inch.

As can be understood from FIG. 1B, when all of the magnetic domains of a vertical disk are aligned in the same direction, i.e., when there are no transitions, the entire surface has a single magnetic polarity and the magnetic field adjacent to the surface of the disk is substantially uniform. In contrast, when there are no transitions in a horizontal disk, the magnetic field varies with location.

After manufacture, the platters of a hard disk drive need to be tested for defects and to ensure that they meet specifications. Testing is typically performed on unformatted disk platters prior to final disk drive assembly. For the reasons discussed above, the specifications are becoming more stringent as smaller disk areas are used for data storage. Small scratches, pits and other defects in the surface of the magnetic film are particularly critical and the existence of any such defects needs to be identified. By identifying the location of spatial defects, data loss is avoided by marking the area as defective prior to use, or by discarding the disk entirely if it is found to have too many defects. It is noted that vertical domains can be smaller than optical detection limits, such that optical inspection of the disk surface cannot be used to identify surface irregularities that impact device performance.

In addition to spatial defects such as scratches or other irregularities in the disk surface, hard disks are also subject to "thermal" defects that may occur along with or separately from the spatial defects. This type of defect is essentially a small bump or protrusion on the surface of the platter, where the height of the bump is such that the read head makes contact with the bump, but is able to continue scanning the surface of the disk (i.e., the bump is not so large that the read head stops functioning). When the read head encounters the bump, the high speed impact causes the read head to increase in temperature (hence the name "thermal" defect). Repeated impacts lead to wear on the read head and can eventually cause the head to "crash" into the surface of the hard disk. As such, thermal defects on a hard disk pose an even greater problem than spatial ones. While spatial defects may limit the amount of disk space available to store data, thermal defects may cause the hard disk to crash, such that data on the disk may or may not be recoverable. For this reason, a disk having predominantly spatial defects and few thermal ones will be more usable than a disk having the same total number of defects, but where a substantial number of the defects are thermal. Accordingly, there is a need for a system and method to identify spatial and thermal defects on a vertical hard disk platter and to distinguish each type of defect from the other.

A common testing technique currently in use is referred to as the "missing pulse test." The missing pulse test involves writing a sinusoidal waveform to the surface of the disk using a write head, and then reading back the recorded signal using a read head. Because a sine wave has two transitions per cycle, the read back frequency is twice the write frequency. Discrepancies, referred to as "dropouts", between what is written and what is read are used to identify disk errors. As domain size has decreased, it has become necessary to use higher frequency to properly analyze the surface of a disk. Currently, write frequencies as high as 200 MHz (and corresponding read frequencies of 400 MHz) may be used.

SUMMARY OF THE INVENTION

As part of making their invention, the inventors have found that defects on perpendicular media can be identified by scanning over the media with a read head when the media is aligned in polarity. Further, when the media is scanned multiple times, with the polarity reversed for each scan, the resulting signals can be combined not only to identify the location of defects, but to distinguish spatial defects from thermal ones.

Accordingly, the present invention is directed to a method and system for testing hard disk platters having vertically oriented magnetic domains to identify and distinguish spatial and thermal defects. In one embodiment, the invention is directed to a method of inspecting an unformatted hard disk platter having vertically oriented magnetic domains for spatial and thermal defects, comprising the steps of orienting the magnetic domains in the same vertical direction and scanning the surface of the disk using a read head to identify perturbations in the magnetic field intensity, orienting the magnetic domains in the opposite vertical direction and scanning the surface again, then combining the resulting signals from the read head to identify the locations of defects and to differentiate between spatial and thermal defects. The step of orienting the magnetic domains can be accomplished by performing a DC erase of the disk surface, such as in a bulk erase operation. Alternatively, the step of performing a DC erase may comprise using a write signal from a write head to sequentially orient domains. Preferably, the step of scanning the surface of the disk comprises sampling the signal picked up by the read head at a high frequency.

In another aspect, the present invention is directed to a system for quality testing hard disks having vertically oriented magnetic domains to distinguish spatial and thermal defects, comprising a write head for orienting the magnetic domains of the hard disk in the same direction, a read head comprising a magnetic sensor for detecting the magnetic field at the surface of the disk adjacent to the read head, a transport mechanism for providing relative motion between the surface of the disk and the read head such that the read head is able to access substantially the entire useable surface of the disk, and a signal analyzer for analyzing the output signal from the read head, wherein the signal analyzer comprises a signal processor for adding and subtracting the signals to produce output signals having improved signal to noise ratios.

These and other features of the present invention will become apparent to those skilled in the art from the following detailed description of the invention, the accompanying drawings, and the appended claims.

DETAILED DESCRIPTION OF THE INVENTION

Figure 1A:
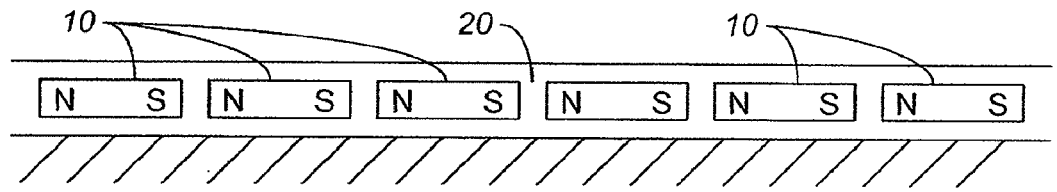
FIG. 1A is a schematic cross-sectional depiction of a portion of the surface of a hard disk having a horizontal magnetic domain orientation.
Figure 1B:
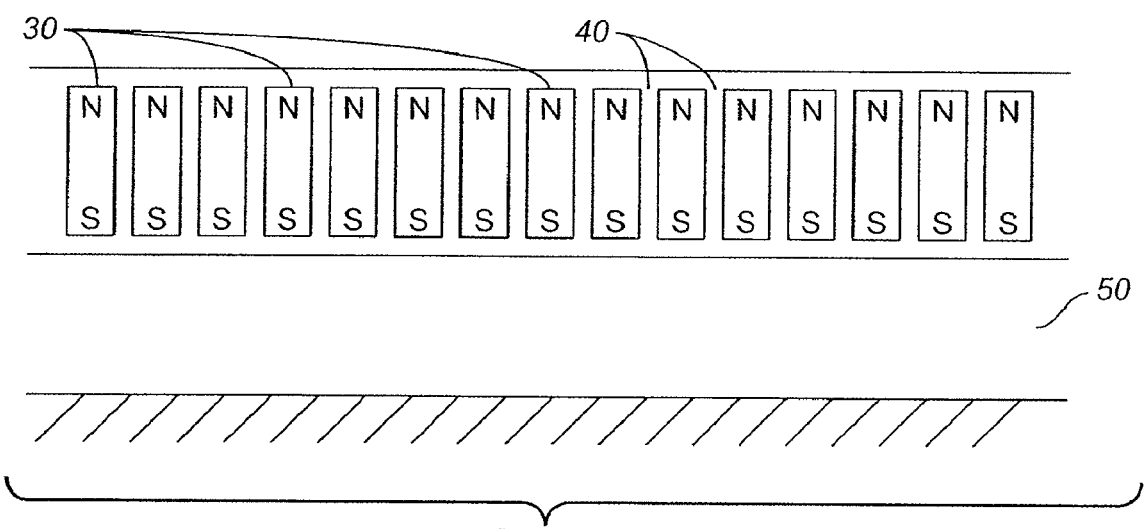
FIG. 1B is a schematic cross-sectional depiction of a portion of the surface of a hard disk having a vertical magnetic domain orientation.

In the following description, numerous specific details are set forth to provide a more thorough description of the specific embodiments of the invention. It is apparent, however, that the invention may be practiced without all the specific features discussed below. In other instances, well known features have not been described in detail so as not to obscure the invention.

The preferred embodiment of the present invention is directed to a method and system for testing the surface of a hard disk platter having vertical magnetic domains to distinguish spatial and thermal defects. The testing contemplated by the present invention is performed after the disk platters are made, but prior to final assembly and formatting of the hard drive. The basic hardware used for testing hard disk platters are known and need not be described in detail. Generally, such devices include a mechanism for rotating the disk, comprising a spindle and one or more radially translatable heads for reading and writing to the disk. Typically, radial head translation uses a carriage assembly. The combination of the disk rotation mechanism and the head translation mechanism constitute a transport mechanism by which a head can access the entire usable surface of the disk.

Commercially available head units frequently combine both read and write functionality in a single unit, referred to as a read/write head, that is mounted on a carriage assembly. Embodiments of the present invention can be implemented using either combined read/write heads, or separate read and write heads, each of which is mounted on a separate carriage. The latter approach is preferred for the testing method and system of the present invention because separate heads provide greater flexibility and control.

The techniques for manufacturing hard disk platters with vertical magnetic domains are known in the art and are not considered to be part of the present invention. Accordingly, the manufacturing techniques will not be described, except to note that the magnetic recording layer is relatively thicker than in a disk having horizontally oriented magnetic domains, and that vertical disks require the use of a relatively thick underlayer of highly permeable magnetic material to act as a return path for the magnetic flux lines. The greater thickness of these layers adds manufacturing complexity and increases the difficulty of obtaining highly uniform films, thereby increasing the likelihood of small surface irregularities.

According to the present invention, the vertical magnetic domains on a disk to be tested are all oriented in the same direction. After manufacture, the magnetic domains on the disk platters are randomly oriented. Accordingly, action is required to orient all of the domains in the same direction. Preferably, this is a achieved by performing a DC erase of the disk, in a known manner. In one technique, a bulk DC erase is performed using a degausser. In an alternate technique, the vertical magnetic domains are oriented in the same direction using a write head. In this alternate technique, it is not necessary that all of the domains on the disk be oriented prior to further testing. Instead, for example, testing can proceed on a track-by-track basis, i.e., the domains in a track are first oriented in the same direction using a write head, and then the properly oriented track is tested using a read head. As described above, when all of the domains in a vertically oriented disk are aligned, the magnetic field adjacent to the surface is, absent any defects, substantially uniform.

Figure 2A:
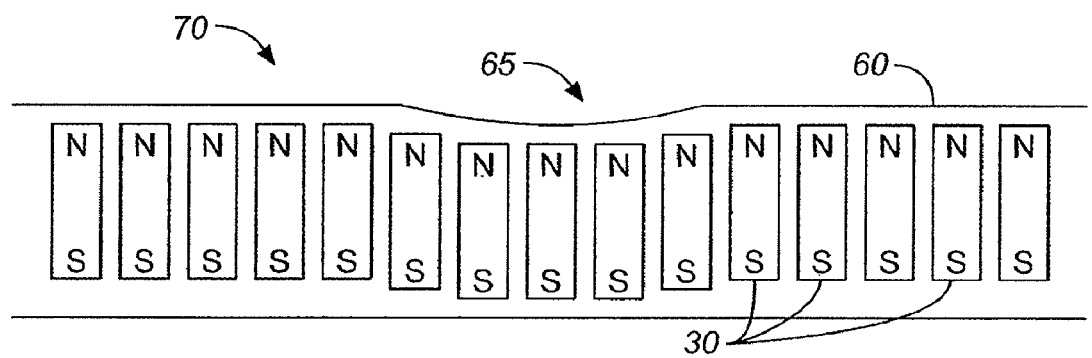
FIG. 2A is a schematic cross-sectional depiction of a portion of the surface of a vertically oriented hard disk platter having a spatial surface irregularity.

According to the present invention, spatial and thermal defects on perpendicular media are distinguished by scanning the vertically oriented magnetic domains having a uniform first polarity, scanning the domains having a uniform second polarity and combining the resulting signals. FIG. 2A schematically depicts a vertical disk surface 60, having vertically oriented magnetic domains 30, with a non-planar region 65 representing a "spatial" defect. Non-planar region 65 may be a pit, a scratch, or other surface defect created as an artifact of the manufacturing process or subsequent disk handling. A read head 70 moves relative to the disk surface 60. As read head 70 passes over spatial defect 65, the spacing between read head 70 and the surface of defect 65 increases and, as a consequence, the magnitude of the magnetic flux detected by head 70 decreases.

Figure 2B:
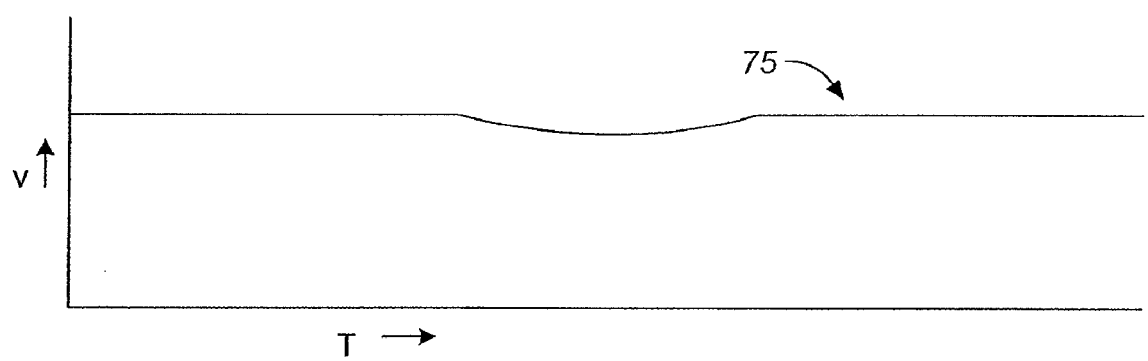
FIG. 2B shows the output signal from a read head as it passes over the defect shown in FIG. 2A.

The read head 70 is preferably a giant magnetoresistive (GMR) sensor. A GMR sensor comprises a material whose resistance varies in response to change in a magnetic field, thus producing an output signal that corresponds to variations in the magnetic field along the surface of the perpendicular media. FIG. 2B shows the output signal 75 from read head 70 as it passes over defect 65 and the adjacent planar regions. The change in resistance is used, in accordance with the present invention, to identify film defects.

Figure 3:
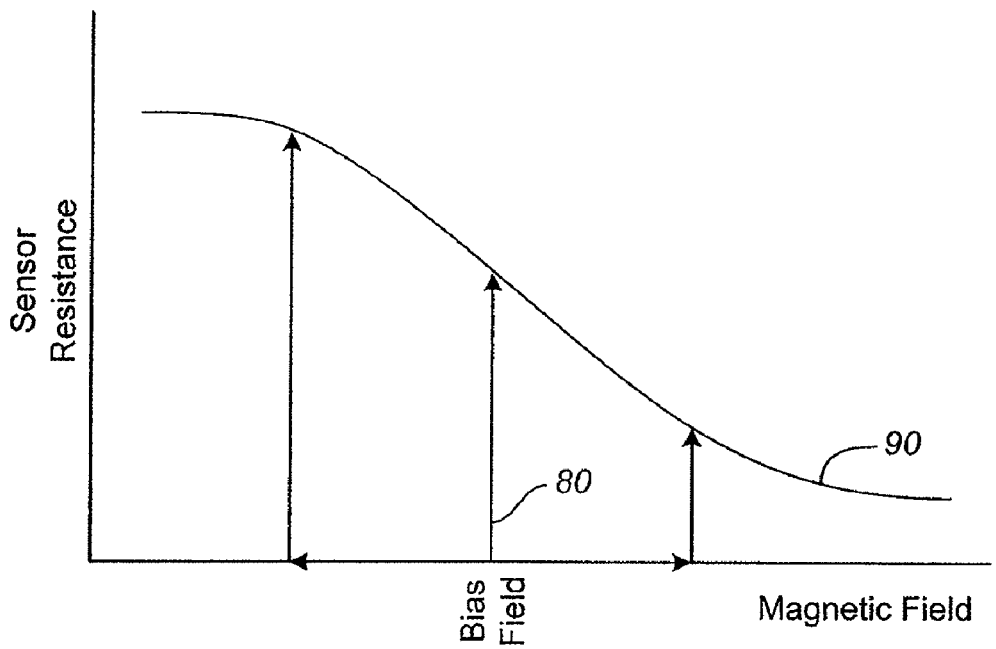
FIG. 3 illustrates the sensor resistance of the read head that corresponds to the magnetic field of the hard disk.

FIG. 3 depicts the relationship between the magnetic field and sensor resistance of a GMR sensor. As is well known, a GMR sensor requires the use of a bias field. A bias field may be applied to the sensor using a small permanent magnet (not shown) or by other known means. Application of the bias field 80 positions the resistance of the sensor in the working range of curve 90, i.e., the portion of the curve that is essentially linear.

Figure 4:
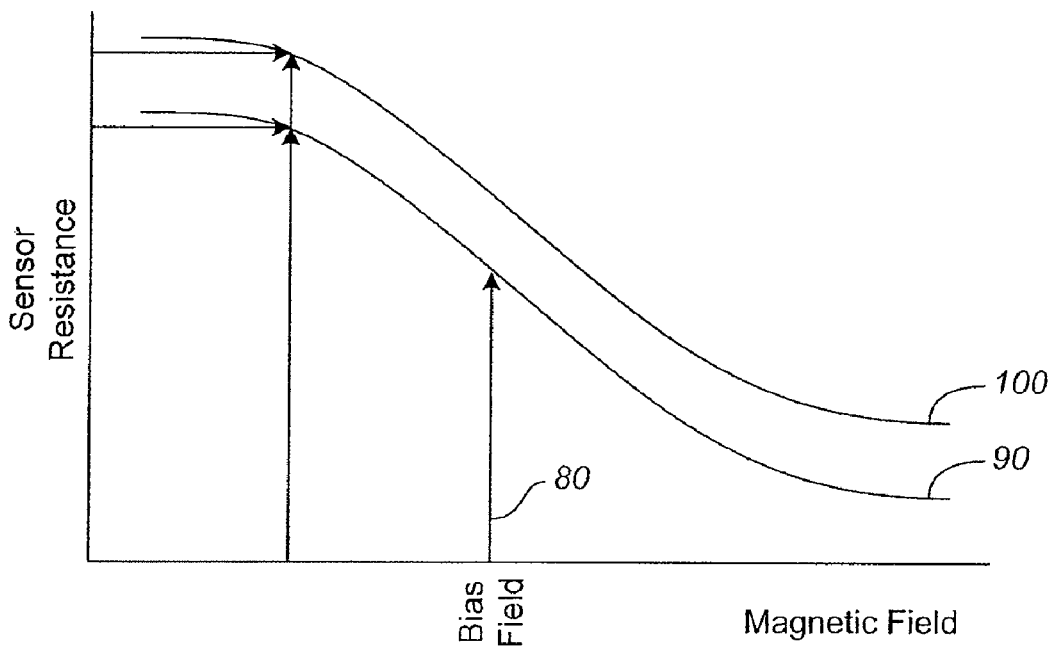
FIG. 4 shows the effect of a change in temperature on the sensor resistance.

A GMR sensor is also sensitive to changes in temperature, increasing resistance with increases in temperature. As shown in FIG. 4, when the temperature of the sensor is increased, the curve 100 is translated upward from the original curve 90. Thus, for any given magnetic field, a higher sensor resistance will be measured when the temperature has been increased. These two sensor responses, as shown in FIGS. 3 and 4, are utilized in the method of the present invention.

Figure 5:
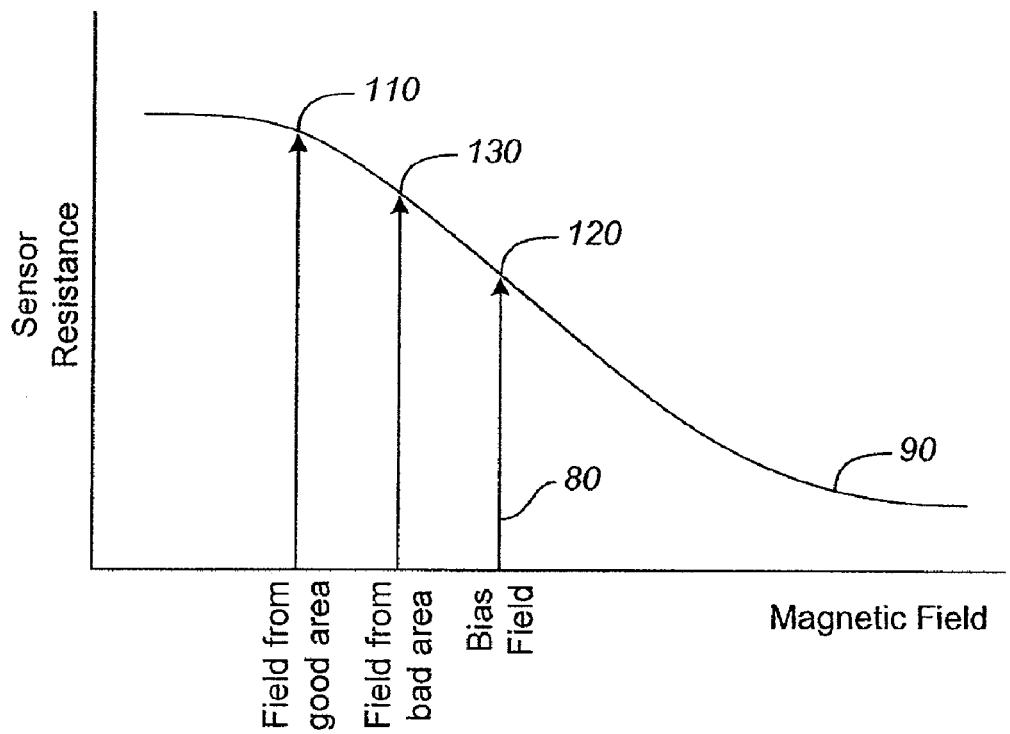
FIG. 5 shows the sensor response between scanning defective and defect-free areas of the disk for a first polarity.

According to a preferred embodiment of the method of the present invention, magnetic domains 30 are oriented in the same direction such that they all have a first polarity, as described with respect to FIG. 2A. Next, read head 70 scans the surface of the disk and variations in the resistance of the sensor are recorded to identify defects. FIG. 5 shows the change in sensor resistance for changes in magnetic field corresponding to defects when the magnetic domains have a first magnetic polarity. When the sensor scans the disk, the magnetic field of the disk surface combines with that of the bias field to alter the magnetic field detected by the sensor, which is shown at point 110, i.e., a point shifted away from the bias point 120. When the sensor scans across a spatial defect, the magnetic flux is decreased because the non-planar region 65 is further away from the sensor than the disk surface 60 and therefore contributes less to the magnetic field detected. Thus, the magnetic field 130 when the sensor is over a defect is moved towards the bias point 120. Accordingly, the sensor resistance is lower when the sensor is over a bad area than it is when the sensor is over a good area 110. The resistance of the sensor is output as a signal discussed below with respect to FIG. 7.

Figure 6:
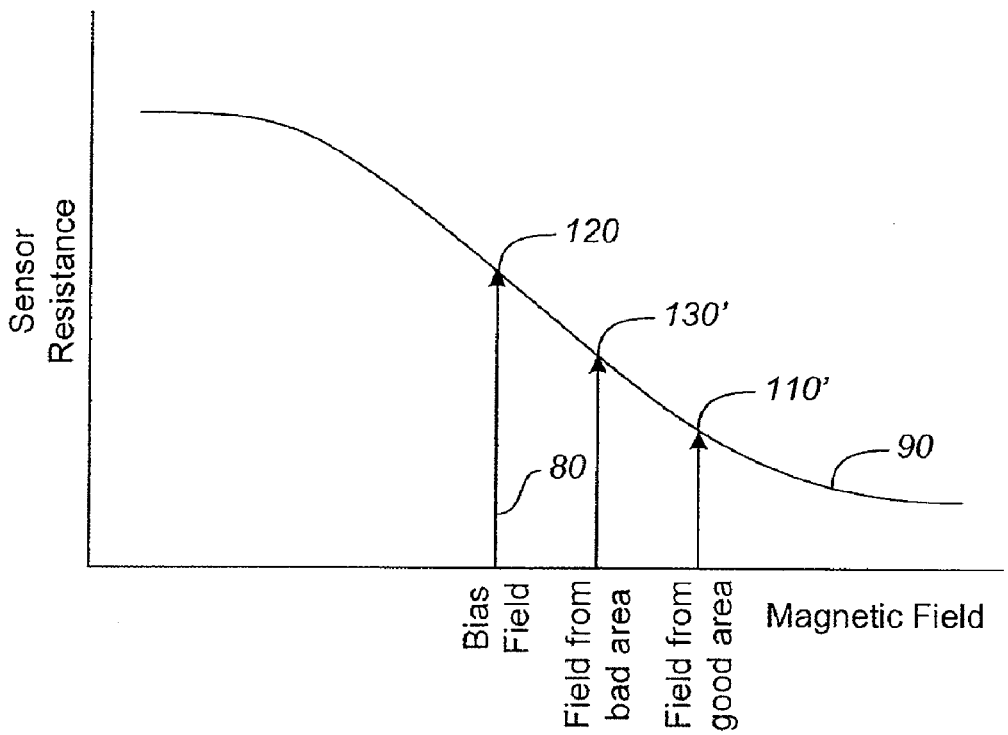
FIG. 6 shows the sensor response between scanning defective and defect-free areas of the disk for a second polarity.

FIG. 6 shows the sensor response, similar to that in FIG. 5, as it occurs when the magnetic domains have the opposite polarity. After the first scan of the disk surface is complete, the magnetic domains 30 are oriented again such that they all have a second polarity that is opposite to the first. Thus, according to the method of the present invention, a second DC erase is then performed on the disk. The second DC erase may be performed as described above. After orienting all of the magnetic domains to the second polarity, the next step of the method involves performing a second scan of the disk surface with read head 70. In this second scan, because the polarity of the magnetic domains is reversed from its orientation during the first scan, the magnetic field 110' that is detected by the sensor (resulting from the combined fields of the magnetization of the disk surface and the bias field) is shifted away from the bias point 120 in the opposite direction from the shift that occurred in the first scan. As before, when the sensor scans over a spatial defect, the magnetic flux is decreased and the magnetic field 130' detected by the sensor is moved toward the bias point 120. However, because of the reversal of polarity, shifting toward the bias point in this scan causes an increase in the sensor resistance rather than the decrease seen with respect to FIG. 5.

It is to be understood that depending on the polarity used for the first scan, the resulting signals may correspond to either FIG. 5 or FIG. 6; the signals related to the second scan (with the opposite polarity) will correspond to the other of the two figures.

Referring again to FIG. 4, it is noted that when the sensor scans over a thermal defect it will increase in temperature, leading to an increase in resistance, regardless of the polarity of the magnetic domains.

Figure 7:
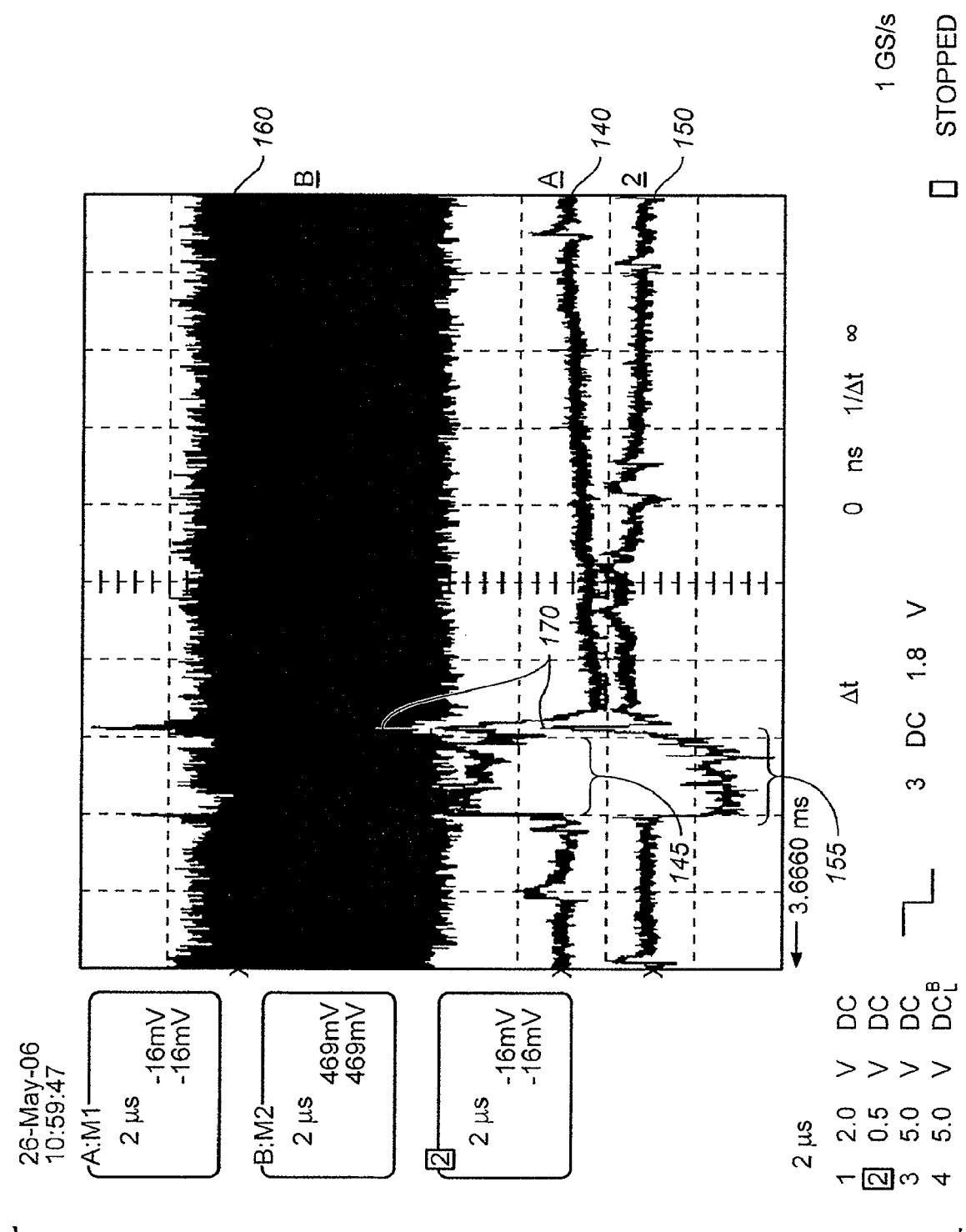
FIG. 7 shows sensor head output signals for first and second polarities of the present invention along with an output signal of the conventional missing pulse technique.

As the sensor scans over the disk surface for each polarity, the resistance of the sensor is output to a signal processor (not shown). FIG. 7 shows the sensor resistance as a function of time as the sensor scans across the surface of the disk. In FIG. 7, the first signal 140 corresponds to the situation described with respect to FIG. 5, where the resistance of the sensor increases over a spatial defect. This change in resistance is seen in region 145, where the signal increases rapidly and then gradually declines. However, there is significant fluctuation in the signal, including spike 170, which occurs as part of signal 140 near the end of region 145. Because of the variations in signal 140, it may be difficult to determine whether signal fluctuations like spike 170 should be interpreted as important signal information, or merely as noise in the portion of the signal indicating the spatial defect (region 145). According to the method of the present invention, however, a second signal 150 is obtained, corresponding to the second scan of the disk surface. In signal 150, a spatial defect is indicated by a decrease in the resistance of the sensor, shown in region 155. Although this second signal 150 also contains some fluctuation, spike 170 is seen in both signals 140 and 150 as an increase in resistance. From that information, spike 170 can be identified as indicating a thermal defect. Signal 160 is shown only for comparison; it is an output signal for a missing pulse scan, described above as a conventional method of testing a hard disk surface.

According to a further step of the preferred embodiment, signals 140 and 150 are processed to improve the signal-to-noise ratios and enhance the differentiation of spatial and thermal defects. In order to identify spatial defects, the signal processor subtracts signal 140 from signal 150, which cancels out spike 170 and background noise, while retaining the majority of the signals related to the spatial defect. As a result, the signal-to-noise ratio of the spatial defect signal is greatly increased over that of the conventional missing pulse test. In contrast, to identify thermal defects, the signal processor sums signal 140 and signal 150. This summation causes the spatial defect information to be substantially cancelled out, along with background noise, leaving the thermal defect information, spike 170, with a greatly improved signal-to-noise ratio.

Figure 8A:
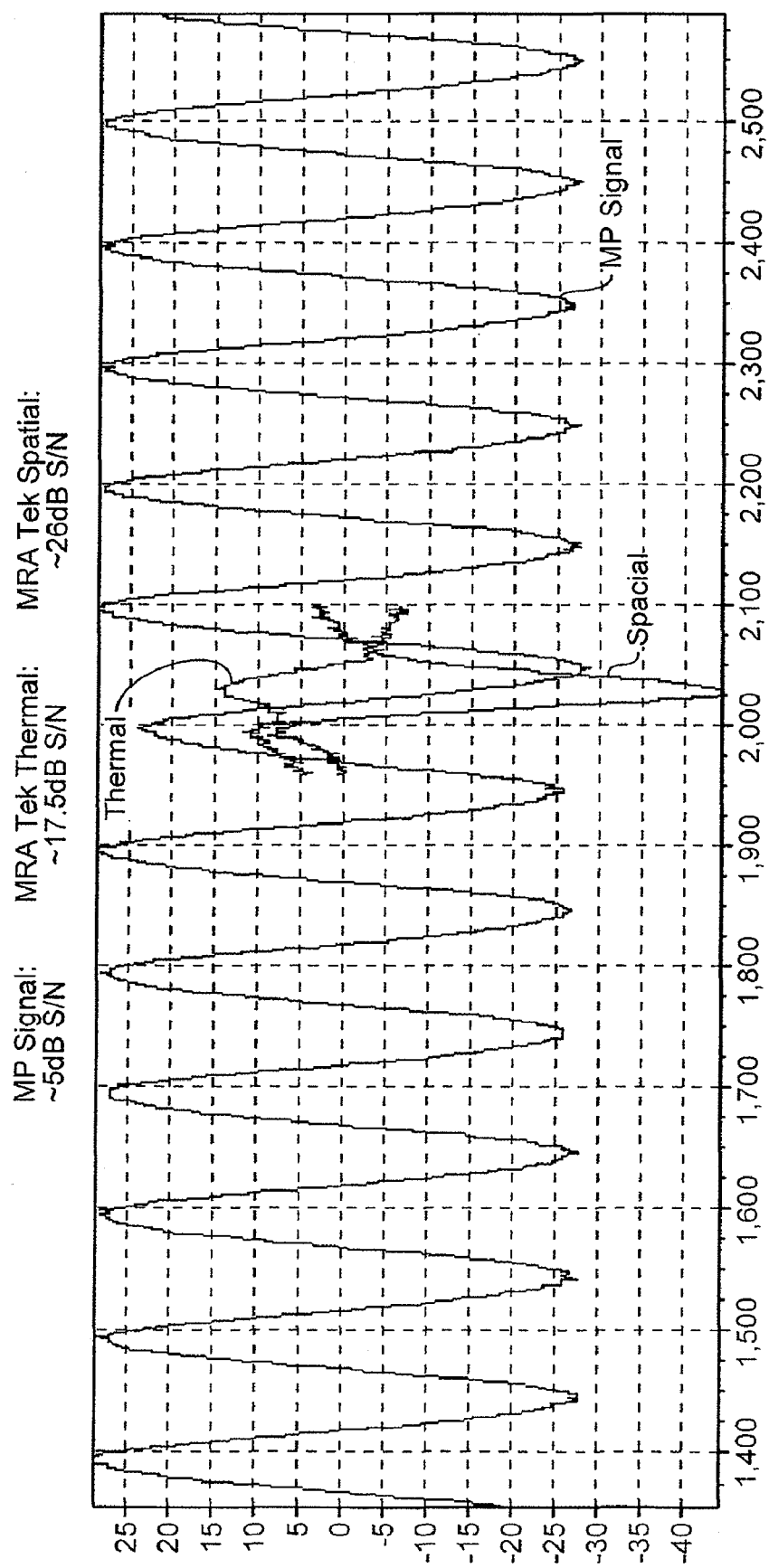
FIGS. 8A-8D show the post-processing signals for spatial and thermal defects according to the present invention in comparison with those of the conventional missing pulse technique.
Figure 8B:
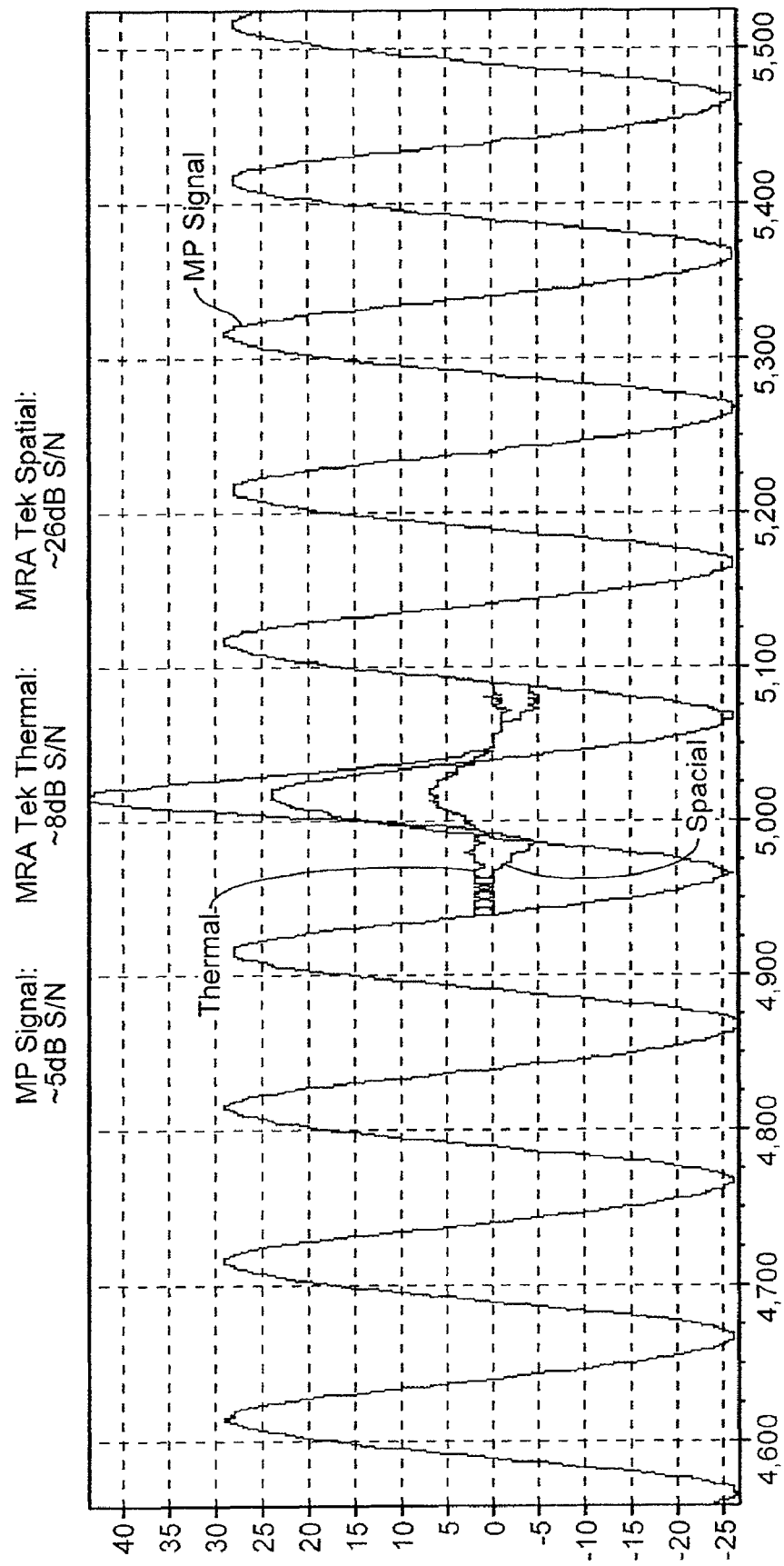
Figure 8C:
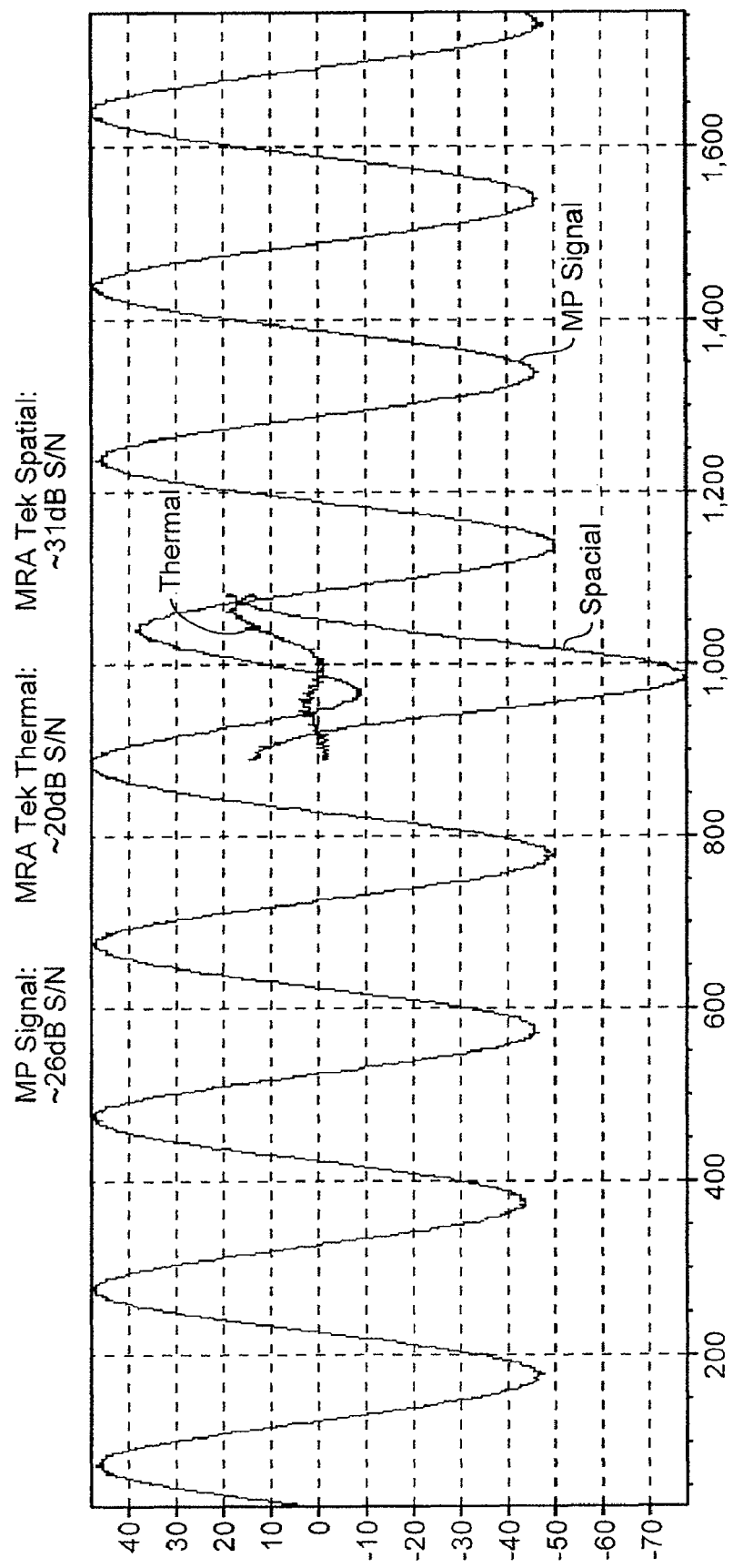
Figure 8D:
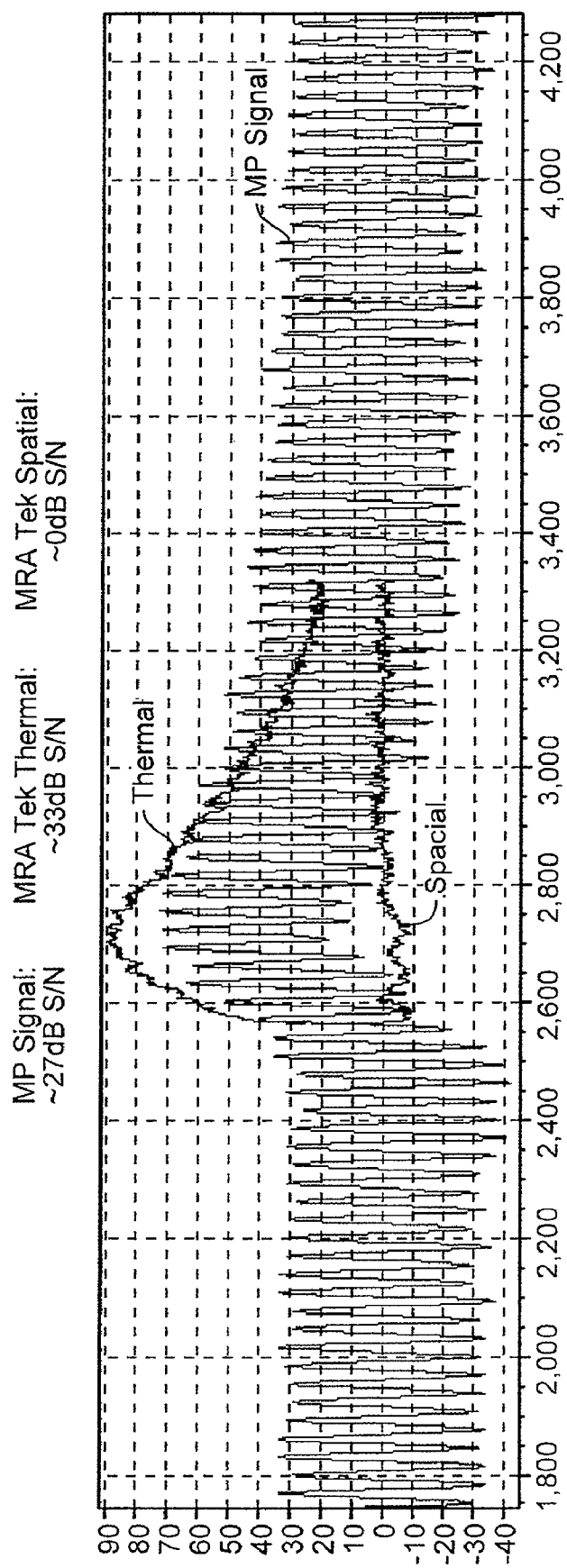
Figure 9:
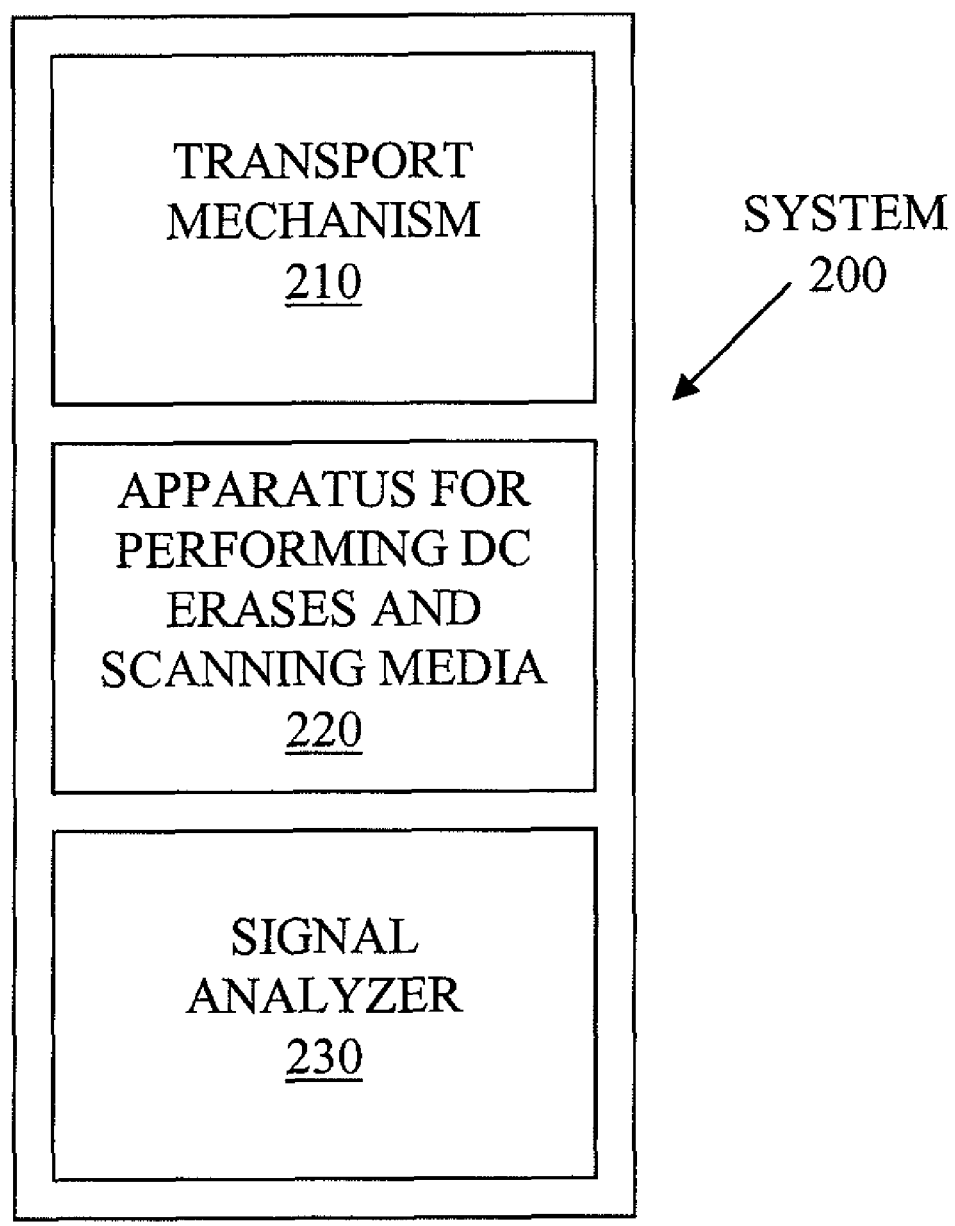
FIG. 9 shows an exemplary system for distinguishing spatial and thermal defects on perpendicular media.
Figure 10A:
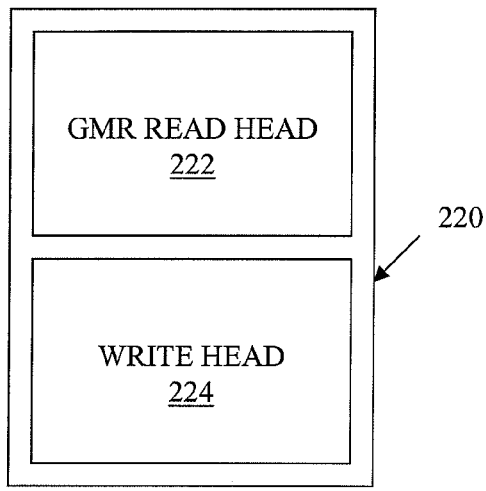
FIGS. 10A-10D show various exemplary apparatus for performing DC erases and scanning media.
Figure 10B:
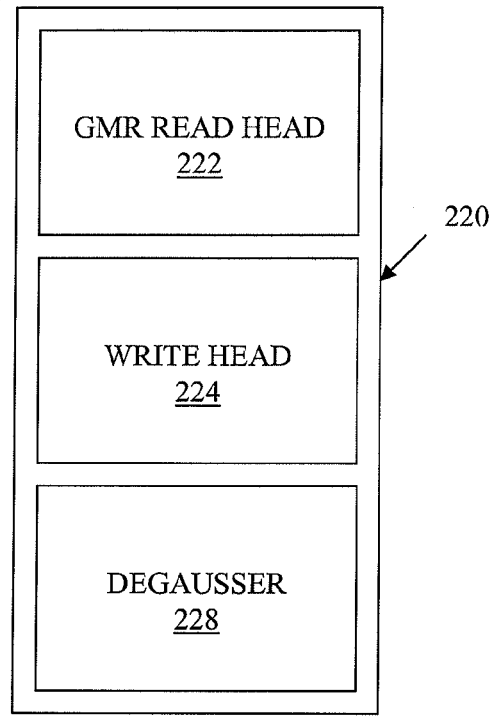
Figure 10C:
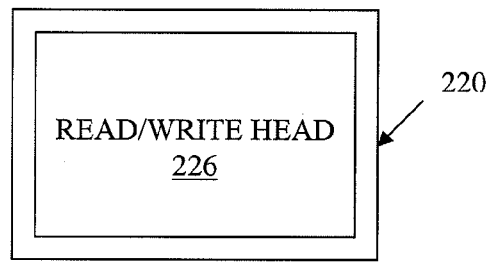
Figure 10D:
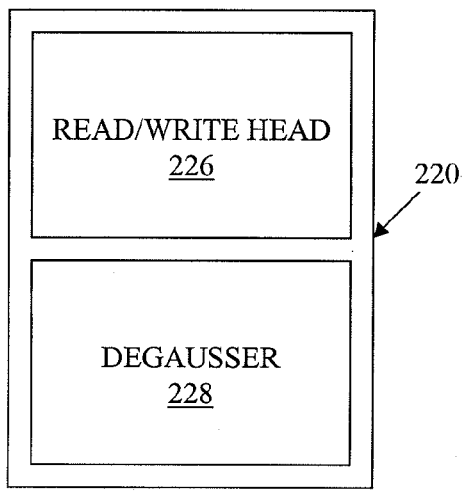

The post-processing signals are shown in FIGS. 8A-8D, along with the conventional missing pulse signal and a comparison of the signal to noise ratios. In FIGS. 8A and 8B, the spatial signal shows more than a 20 dB improvement in signal to noise ratio over the missing pulse technique and the thermal signal also shows a significant improvement, though less than the spatial signal. As can be seen in FIG. 8C, even when the missing pulse technique provides a good signal to noise ratio, the technique of the present invention still provides an improved ratio. Finally, FIG. 8D shows a 6 dB increase in signal to noise ratio for the thermal signal over the missing pulse technique where the defect has no spatial component (i.e., the defect is purely thermal, not spatial).

Turning now to FIGS. 9 and 10A-10D, a system 200 for distinguishing spatial and thermal defects may include at least one apparatus 220 for performing the DC erases on the disk and scanning the disk to produce the signals. The apparatus 220 may include a read/write head 226 which may be capable of performing both the DC erases and the scanning. Alternatively, the apparatus 220 may include a write head 224 for performing the DC erases and a read head 222, such as a GMR read head 222, for scanning. The apparatus may additionally include a degausser 228 for performing the DC erases.

The system 200 may additionally include a transport mechanism 210 for moving the read head or the read/write head relative to the disk. The system 200 may additionally include a signal analyzer 230 for comparing the signals from the read head or the read/write head, identifying defects, and distinguishing thermal defects from spatial defects.

While the present invention has been particularly described with respect to the illustrated embodiments; it will be appreciated that various alterations, modifications and adaptations may be made based on the present disclosure, and are intended to be within the scope of the present invention. While the invention has been described in connection with what are presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. A system for distinguishing spatial and thermal defects on perpendicular media comprising:
    an apparatus for:
        performing first and second DC erases having first and second polarities, respectively, on the perpendicular media, and
        scanning the perpendicular media to produce first and second signals;
    a transport mechanism for providing relative motion between a surface of the perpendicular media and the apparatus; and
    a signal analyzer for:
        comparing the first signal with the second signal,
        identifying locations on the perpendicular media having defects using one or both of the signals, and
        using the comparison to distinguish the locations having thermal defects from the locations having spatial defects.

2. The system of claim 1, wherein the apparatus comprises a read/write head for performing the DC erases and scanning the perpendicular media to produce the signals.

3. The system of claim 1, wherein the apparatus comprises a write head for performing the DC erases and a read head for scanning the perpendicular media to produce the signals.

4. The system of claim 1, wherein the apparatus comprises a degausser for performing the DC erases and a read head or a read/write head for scanning the perpendicular media to produce the signals.

5. The system of claim 1, wherein the apparatus comprises a read head for scanning the perpendicular media to produce the signals, where the read head comprises a GMR sensor.

6. The system of claim 5, where the GMR sensor produces the first and second signals in response to changes in a magnetic field.

7. The system of claim 6, where the changes in the magnetic field correspond to spatial defects.

8. The system of claim 5, where the GMR sensor produces the first and second signals in response to changes in temperature.

9. The system of claim 8, where the changes in temperature correspond to thermal defects.

10. The system of claim 1, where comparing the first signal with the second signal comprises adding the first and second signals.

11. The system of claim 1, where comparing the first signal with the second signal comprises subtracting the first and second signals.

12. The system of claim 1, where comparing the first signal with the second signal comprises adding and subtracting the first and second signals.

13. A disc drive for storing data on perpendicular media and for distinguishing spatial and thermal defects on the perpendicular media, comprising:
    an apparatus for:

storing the data, performing first and second DC erases having first and second polarities, respectively, on the perpendicular media, and scanning the perpendicular media to produce first and second signals;

a transport mechanism for providing relative motion between a surface of the perpendicular media and the apparatus; and a signal analyzer for:

comparing the first signal with the second signal, identifying locations on the perpendicular media having defects using one or both of the signals, and using the comparison to distinguish the locations having thermal defects from the locations having spatial defects.

14. The disc drive of claim 13, wherein the apparatus comprises a read/write head for storing the data, performing the DC erases, and scanning the perpendicular media to produce the signals.

15. The disc drive of claim 13, wherein the apparatus comprises a write head for storing the data and performing the DC erases and a read head for scanning the perpendicular media to produce the signals.

16. The disc drive of claim 13, wherein the apparatus comprises a degausser for performing the DC erases and at least one member of the group consisting of:

a write head for storing the data and a read head for scanning the perpendicular media to produce the signals; and a read/write head for storing the data and for scanning the perpendicular media to produce the signals.

17. The disc drive of claim 13, wherein the apparatus comprises a read head for scanning the perpendicular media to produce the signals, where the read head comprises a GMR sensor.

* * * * *